United States Patent
Lubeley et al.

(10) Patent No.: US 12,265,771 B2
(45) Date of Patent: Apr. 1, 2025

(54) METHOD FOR DIVIDING SIMULATION MODELS UP BETWEEN A PROCESSOR AND AN FPGA

(71) Applicant: dSPACE GmbH, Paderborn (DE)

(72) Inventors: Dominik Lubeley, Paderborn (DE); Andreas Agne, Paderborn (DE)

(73) Assignee: DSPACE GMBH, Paderborn (DE)

(*) Notice: Subject to any disclaimer, the term of this patent is extended or adjusted under 35 U.S.C. 154(b) by 623 days.

(21) Appl. No.: 17/697,095

(22) Filed: Mar. 17, 2022

(65) Prior Publication Data

US 2022/0309218 A1  Sep. 29, 2022

(30) Foreign Application Priority Data

Mar. 26, 2021  (DE) .................. 102021107636.6

(51) Int. Cl.
*G06F 30/34*  (2020.01)
*G06F 30/12*  (2020.01)

(52) U.S. Cl.
CPC .............. *G06F 30/34* (2020.01); *G06F 30/12* (2020.01)

(58) Field of Classification Search
USPC ........................................ 716/117
See application file for complete search history.

(56) References Cited

U.S. PATENT DOCUMENTS

| | | | |
|---|---|---|---|
| 7,509,244 B1 | 3/2009 | Shakeri et al. | |
| 8,863,069 B1* | 10/2014 | Venkataramani | G06F 30/30 716/134 |
| 10,454,713 B2 | 10/2019 | Hobro | |
| 2005/0131666 A1* | 6/2005 | Tsai | G06F 30/33 703/17 |
| 2008/0307332 A1* | 12/2008 | Hayles | G06F 3/04817 715/764 |
| 2010/0058269 A1* | 3/2010 | Baker | G06F 30/327 716/122 |

FOREIGN PATENT DOCUMENTS

EP  1971944 B1  9/2008

* cited by examiner

*Primary Examiner* — Mohammed Alam
(74) *Attorney, Agent, or Firm* — LEYDIG, VOIT & MAYER, LTD.

(57) ABSTRACT

A method for dividing a graphical simulation model up into a first sub-model and a second sub-model includes: identifying at least one first block as belonging to the first sub-model and identifying at least one second block as belonging to the second sub-model based on a sampling time and/or a resource allocation; searching for cyclic groups of blocks, wherein a cyclic group whose blocks all have the same sampling time is deemed to be atomic; identifying non-cyclic groups of blocks; allocating individual blocks from the cyclic groups of blocks and the non-cyclic group of blocks to either the first sub-model or the second sub-model, wherein all blocks of an atomic cyclic group are allocated to the same sub-model; generating program code for the processor from the first sub-model; and generating a configuration bitstream for the programmable logic module from the second sub-model.

15 Claims, 5 Drawing Sheets

METHOD FOR DIVIDING SIMULATION MODELS UP BETWEEN A PROCESSOR AND AN FPGA

CROSS-REFERENCE TO PRIOR APPLICATIONS

This application claims benefit to German Patent Application No. DE 102021107636.6, filed on Mar. 26, 2021.

FIELD

The invention relates to a method for dividing up simulation models that can be collectively executed on a processor and a programmable logic module.

BACKGROUND

Simulation models of this kind are used, for example, as part of a hardware-in-the-loop simulation, in which control devices, in particular control devices for motor vehicles, undergo a test for their correct functioning. For this purpose, the control device to be tested is connected to an electronic circuit having input and/or output channels, also referred to as an I/O circuit, in order to impress signals on the control device via the circuit and/or to detect signals generated by the control device.

The signals to be output by the I/O circuit are ascertained by running the software model of a test environment on a simulation environment, for example the simulation of a journey in the case of a motor vehicle. Simulated events are applied to the output channels, e.g., the pins or register of the output channels of the circuit, by electrical signals that represent the events, in order to thus be transmitted to the control device, and/or signals are applied by the control device to the input channels, e.g., the pins or register of the input channels of the circuit, in order to thus be able to be detected and processed in the simulation environment. In this way, a control device can be run in a simulated environment as if it were actually being run in the real environment.

The simulation environment, or simulator for short, is formed, for example, by a real-time computer system having at least one processor that executes the software model. For example, the model can be provided by real-time software or a multiplicity of interacting software tools, which preferably has a graphical user interface and, particularly preferably, is programmed via software objects. The software can include MATLAB, Simulink or RTI (Real-Time Interface), which forms a connecting link to Simulink, for example. In the aforementioned cases, software objects are programmed, for example, graphically as a block, in particular hierarchically. However, a simulation environment is not limited to using said pieces of software, each of which is stated by way of example. The software model can be run on the simulation environment either immediately after programming or after code generation and compilation.

In addition to the processor circuit, which comprises the at least one processor, the simulation environment often comprises at least one I/O circuit that is connected to the processor circuit and has said input/output channels. These are used for outputting electrical signals at the pins of the output channels and/or for detecting, at the pins of the input channels, electrical signals being applied thereto, for example as a result of an analog-to-digital conversion, in order to supply the detected signals for further processing, be it on said electronic circuit or on other electronics connected to the circuit. In addition, at least one such I/O circuit comprising input and/or output channels can be connected to a circuit comprising a programmable logic module, in particular a field programmable gate array (FPGA), in order to receive signals therefrom or provide signals thereto. The FPGA circuit can in turn be connected to the processor circuit such that the simulation model can be executed in part on the FPGA circuit and in part on the processor circuit.

In particular, a real-time computer system differs from commercially available computer systems in that a predetermined latency is not exceeded, for example between the inputting of an altered sensor signal and the resulting reaction, like the outputting of an altered actuation signal. Depending on the system to be simulated, a maximum latency of, for example, 1 millisecond or less may be required. In particular, a simulation of the drive of an electrical vehicle (eDrive) or a simulation of power electronics places high demands on the speed of the control loop, in particular with maximum permitted latencies in the microsecond range; consequently, real-time simulations are often no longer covered by mere processor models and processor-controlled I/O channels, but rather the time-critical model parts are executed on a freely programmable FPGA circuit. In this case, the FPGA circuit is preferably configured such that different I/O circuits can be connected thereto in a modular manner.

Therefore, real-time computer systems having heterogeneous arithmetic logic units, such as one or more processors and one or more programmable logic modules, are used in particular for complex real-time simulations in the fields of e-mobility, ADAS, or power electronics. Up to now, which model portion to execute in which domain (processor, FPGA) had to be set and modeled manually by users. EP 1971944 B1 describes automatically swapping out submodels into another domain, although in this case only an exploratory trial-and-error approach is used, in which iterations are run until a particular performance criterion is met, such as a predetermined time response.

Up to now, manual identification and shifting of the model boundary between the processor and FPGA portions have been necessary in the following typical use cases in which model parts have to be (re)assigned to different domains:
  Dividing up the model during designing
  Refined FPGA models that outgrow the resources of the FPGA used
  Migrating a project to a different FPGA platform having more/fewer resources
  Assigning large FPGA applications to a plurality of FPGAs

SUMMARY

In an exemplary embodiment, the present invention provides a method for dividing a graphical simulation model up into a first sub-model and a second sub-model. Functionality of the graphical simulation model is modeled in the form of blocks that are connected by signals at least in part. The blocks are periodically executed and each block of the simulation model is allocated a sampling time. The first sub-model is to be executed on a processor and the second sub-model is to be executed on a programmable logic module. The method comprises the successive steps of: a. identifying at least one first block as belonging to the first sub-model and identifying at least one second block as belonging to the second sub-model based on the sampling time and/or a resource allocation; b. searching for cyclic groups of blocks, wherein a cyclic group whose blocks all have the same sampling time is deemed to be atomic; c. identifying non-cyclic groups of blocks; d. allocating individual blocks from the cyclic groups of blocks and the non-cyclic group of blocks to either the first sub-model or the second sub-model, wherein all blocks of an atomic cyclic group are allocated to the same sub-model; e. generating program code for the processor from the first sub-model; and f. generating a configuration bitstream for the programmable logic module from the second sub-model.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
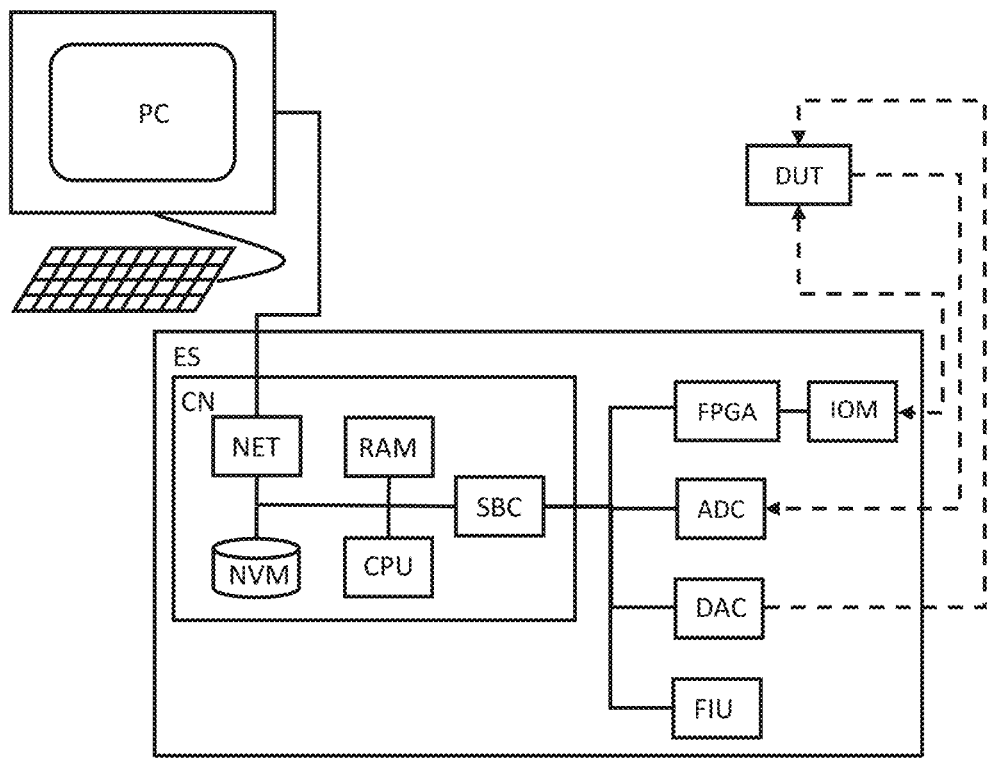
FIG. 1 is a schematic view of an example hardware-in-the-loop test environment.

Exemplary embodiments of the invention provide a method and an apparatus that allow simulation models to be divided up into processor and FPGA portions in an automatic or computer-assisted manner.

Exemplary embodiments of the invention provide a method for dividing a graphical simulation model up into a first sub-model and a second sub-model and a computer system.

In an exemplary embodiment, what is provided is a method for dividing a graphical simulation model up into a first sub-model and a second sub-model, the functionality of the simulation model being modeled in the form of blocks that are connected by signals at least in part, the blocks being periodically executed and each block of the simulation model being allocated a sampling time, the first sub-model being intended for being executed on a first arithmetic logic unit, in particular a processor, and the second sub-model being intended for being executed on a second arithmetic logic unit, in particular a programmable logic module. The method comprises the successive steps of:

a. identifying at least one first block as belonging to the first sub-model, and identifying at least one second block as belonging to the second sub-model, the association being determined on the basis of the sampling time and/or a resource allocation, b. searching for cyclic groups of blocks, a cyclic group whose blocks all have the same sampling time being deemed to be atomic, c. identifying non-cyclic groups of blocks, d. allocating the individual blocks from the groups to the first sub-model or to the second sub-model, all the blocks of an atomic cyclic group being allocated to the same sub-model, e. generating code for the first arithmetic logic unit, in particular program code, from the first sub-model, and f. generating code for the second arithmetic logic unit, in particular a configuration bit stream, from the second sub-model.

A cyclic group comprises two or more blocks that are connected via at least one signal, a first block of the cyclic group outputting a signal to a second block in the group and receiving an output signal of the second block at least indirectly. If the cyclic group comprises three or more blocks, the output signal of the second block can initially be an input signal of a third block, and the output signal of the third block can be connected to the first block; the first block thus does not receive the output signal of the second block directly, but rather an interim operation takes place in the third block. In relatively large cyclic groups, further blocks can be interposed accordingly.

In the case of a non-cyclic group of blocks, between the blocks there is no feedback in which an output signal of a block that is downstream in the signal course is connected back to the first block in the signal course.

The sampling time can be explicitly allocated to the blocks or can result from an inheritance or propagation. For example, the simulation model can have a hierarchical design, in which a plurality of subordinate blocks implement the functionality of a superordinate block and a sampling time of the superordinate block is carried over for all the subordinate blocks. In the case of a block that models an access to a hardware interface, such as an I/O port, the sampling time can be determined by properties of the hardware. In the case of a plurality of blocks connected by a signal line, a sampling time of one of the blocks can also be propagated or carried over for all the blocks connected via signals.

The invention provides a deterministic, rule-based method which, by transforming and analyzing a complete model, proposes the boundary between the processor and FPGA portion for all signal paths at a suitable point and/or gives proposals for shifting an existing boundary. For this purpose, the model is subdivided into partitions that are suitable for being executed on the FPGA or on the processor or FPGA.

Preferably, the modeler can shift the proposed boundaries in each case toward the FPGA or the processor in a model view that displays the partitions, for example by way of coloring. The invention is advantageous in that it is suitable for cycle-accurate, i.e., precisely coordinated, modeling by which very complex control loops can be implemented, for example in the eDrive field. A method according to the invention is applicable to various types of arithmetic logic units such as CPUs, GPUs, and FPGAs. In addition, it can also be used for a relatively large number of sub-models.

For hierarchical simulation models in which the simulation model comprises at least one block in a first hierarchical level and at least one block in a second hierarchical level, the blocks of the simulation model are preferably merged in a common hierarchical level before the further steps. This simplifies and speeds up the division of the model.

If the simulation model includes input ports, output ports, and/or buses, the step of merging the blocks of the simulation model in a common hierarchical level preferably comprises removing at least some of the input ports, output ports, and/or buses and inserting corresponding signals. In this regard, what is primarily meant by input ports and output ports are intra-model communications blocks that connect different regions or hierarchical levels of the model. In addition, a pair made up of a Goto block and a From block, which indicates a data link between two blocks or model parts, can expediently be treated as a pair made up of an input port and an output port and be removed or replaced with a signal line. I/O ports that are permanently allocated to a hardware resource such as an I/O pin of an FPGA or a converter module of an I/O board remain in the model.

Preferably, a block is identified as belonging to the second sub-model when one or more of the following conditions are met:
I. the block is allocated a sampling time that is below a predetermined sampling threshold;
II. the block is allocated a latency that is below a predetermined latency threshold;
III. the block is allocated a resource of the programmable logic module, such as in particular an I/O pin of the programmable logic module.

Blocks having particularly high time-response demands, such as frequent sampling and/or a short latency, are expediently allocated to the second sub-model, which is executed on the programmable logic module or FPGA. In blocks having direct hardware access, the model allocation immediately follows the corresponding hardware unit.

Preferably, a block is identified as belonging to the first sub-model when one or more of the following conditions are met:
I. the block describes a function call, in particular a function of the operating system and/or an access to a network interface;
II. the block is allocated a resource of the processor, such as in particular a register of the processor.

Blocks that model a software interface or address a hardware resource of the processor are expediently allocated to the first sub-model.

It is advantageous if the step of searching for cyclic groups comprises a recursive subdivision, a check being carried out for a discovered cyclic group as to whether all the blocks have the same sampling time, and the cyclic group being deemed to be atomic and being retained if that is the case, otherwise the cyclic group is subdivided, among blocks having different sampling times, into new cyclic or non-cyclic sub-groups until there are no more subdivisible cyclic groups. A counter can preferably also be treated as a cyclic group made up of an adder and a register. Expediently, an atomic cyclic group is allocated only as a whole to the first or second sub-model.

According to a preferred embodiment of the invention, the step of allocating the individual blocks from the groups to the first sub-model or to the second sub-model is carried out on the basis of a predetermined rule. A set of rules made up of a plurality of interleaved conditions can also be specified. By executing rules that check one or more conditions, it is possible to allocate the blocks quickly and reproducibly.

Particularly preferably, according to the rule, all the blocks that need not be executed on the programmable logic module are allocated to the first sub-model. As a result, only the particularly time-critical blocks are executed on the FPGA, and the often-scarce resources of the programmable logic module are conserved.

In particular, it can be provided that a block also has to be or is executed on the programmable logic module when it is connected, by way of a signal, to a block that has been identified as belonging to the second sub-model, and the signal has a higher bit width than a width threshold and/or a higher change frequency than a change threshold and/or the signal has a shorter latency than a signal latency threshold. The bandwidth, as a product of the signal width and the change frequency, can also be considered, a block being executed on the FPGA when the bandwidth exceeds a predetermined bandwidth threshold. It can be provided that a plurality of signals are considered to be one signal having a cumulative or summated bit width. If a large volume of data has to be transmitted between two blocks, said blocks are expediently arranged on the same arithmetic logic unit, in particular the programmable logic module. If signals need to be transmitted between two blocks only having a low latency, it is advantageous to execute or implement these blocks on the programmable logic module.

Preferably, after the step of allocating the individual blocks from the groups to either the first sub-model or the second sub-model, a graphical depiction of the divided model is displayed via a user interface. Changes to the division are expediently received via the user interface.

Particularly preferably, on the basis of an additional rule, blocks that can be allocated to both the first sub-model and the second sub-model are identified, these blocks being shown in highlighted form on the user interface. These blocks are allocated on the basis of a user input. In particular, in accordance with the additional rule, a block that can be allocated in any manner can be identified on the basis of the lack of a resource allocation. For example, using a slider, a user can specify a portion of the model that is executed on the programmable logic module; alternatively or additionally, it can also be provided that desired boundaries can be inserted into the graphical depiction of the model. In particular, desired boundaries can be received by way of a mouse movement. The boundaries set by the user are expediently stored in the model properties or a block intended therefor in the model, in particular by storing an altered allocation as a block parameter. Alternatively, the boundaries set by the user can be saved in a separate file or a database. This allows for the concurrent existence of a plurality of different partitionings, it being possible for an active partitioning in particular to be the default.

Preferably, after the step of allocating the individual blocks from the groups to either the first sub-model or the second sub-model, an additional step of inserting communications blocks is carried out, a check being carried out for two blocks connected by a signal as to whether these two blocks are allocated to different sub-models, and a pair of communications blocks being inserted if that is the case, said communications blocks implementing a data exchange between the processor and the programmable logic module.

In a preferred embodiment of the invention, the method comprises the further steps of:

g. transmitting the program code and the configuration bit stream to a real-time computer system comprising a processor and a programmable logic module, and h. performing a simulation, with the processor executing the program code and the functionality of the programmable logic module being determined by the configuration bit stream.

The application generated from a simulation model divided up in accordance with the invention, which application comprises program code for a processor and a configuration for a programmable logic module, can be executed directly. A real-time computer run using the corresponding program code or configuration bit stream can perform a simulation or generally provide any functionality specified in the simulation model.

Furthermore, the invention relates to a computer system comprising an operator computer, which has a user interface and a real-time computer having a processor, a programmable logic module and I/O circuits. Instructions for carrying out a method according to the invention are stored on a non-volatile memory of the computer system.

Furthermore, the invention relates to a non-volatile data carrier comprising a computer-readable storage medium having commands embedded therein which, when executed by a processor, cause the processor to be configured to carry out a method according to the invention. Often, an operator computer of a real-time computer system has a modeling environment and is thus particularly well suited for dividing up the model in accordance with the invention. In addition, program code or an FPGA configuration can be created in an automated manner and executed on the real-time computer system, resulting in high user convenience.

The invention will now be described in more detail with reference to the drawings, in which like parts are designated by the same reference numerals. The illustrated embodiments are highly schematic, i.e., the distances and the lateral and vertical dimensions are not true to scale and, unless indicated otherwise, do not have any derivable geometric relationships to each other either.

FIG. 1 schematically shows an example hardware-in-the-loop test environment, comprising an operator computer PC, a simulator ES, and a control device DUT to be tested. The operator computer PC can be configured as a commercially available personal computer having a monitor, input devices, and one or more network interfaces.

The real-time simulator ES comprises a computing node CN, which is connected to the operator computer PC via a network interface NET. The computing node CN has at least one processor CPU, in particular a multi-core processor, a main memory RAM, and a non-volatile memory NVM, which preferably stores an operating system and/or a bootloader. A logic board having a programmable logic module FPGA, two I/O circuits ADC, DAC, and an error simulation circuit FIU are connected to the computing node via a high-speed bus SBC or a corresponding controller. The programmable logic module FPGA is preferably freely programmable and can be configured in accordance with the present invention. The simulator ES can also have a plurality of logic boards or a plurality of programmable logic modules FPGA on a logic board. The logic board preferably has one or more slots for I/O modules. Also shown is an I/O module IOM, which is connected to the control device DUT to be tested and can, for example, exchange digital input and output signals therewith. The I/O circuit ADC has one or more analog-to-digital converters, which receive(s) analog signals of the control device DUT to be tested. Via the I/O circuit DAC, which has one or more digital-to-analog converters, the simulator ES can output analog signals to the control device DUT to be tested. The error simulation circuit FIU can apply defined electrical errors, for example a short-circuit of two channels, to connected devices.

Freely programmable logic modules FPGA are used in particular for applications such as eDrive and power electronics because particularly fast control loops occur in those fields. Expediently, logic boards comprising an FPGA of this kind have a plurality of ports for I/O modules; for example, dSPACE markets the DS6601 FPGA Base Board having five ports that can be equipped with different I/O modules. By fitting a new I/O module, for example, an existing test environment can be expanded with high-resolution analog-to-digital conversion.

Figure 2:
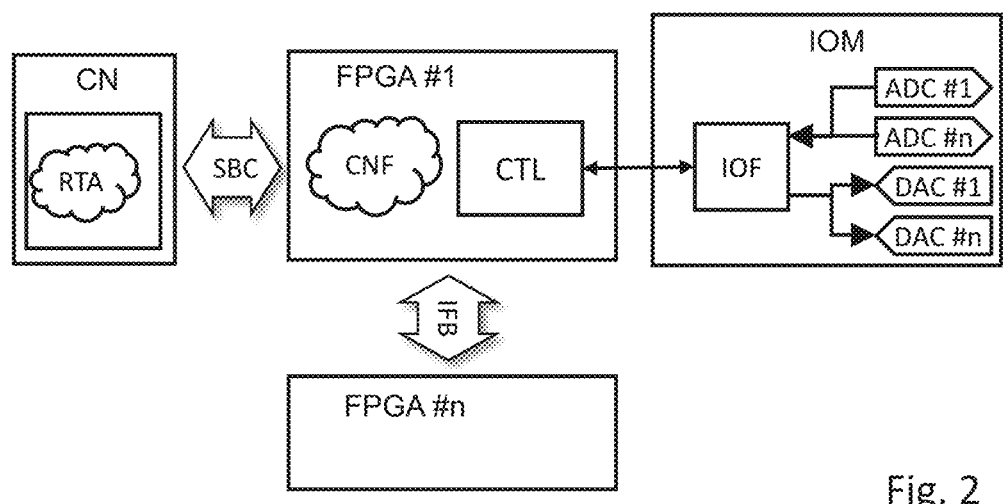
FIG. 2 is a schematic view of a simulator that executes a first sub-model on a processor and a second sub-model on an FPGA.

FIG. 2 is a schematic view of a simulator that executes a first sub-model on a processor and a second sub-model on an FPGA. A first sub-model RTA is stored on the computing node CN and is executed as a real-time application by the processor of the computing node. The programmable logic module FPGA #1 is configured such that a second sub-model CNF is implemented on one part of the surface area and a control module CTL is implemented on another part of the surface area. The control module CTL is connected, via a module IOF, to an I/O module TOM which has analog-to-digital converters ADC #1, ADC #n and digital-to-analog converters DAC #1 and DAC #n. The computing nodes and programmable logic module are connected via the high-speed bus SBC. The programmable logic module FPGA #1 is connected to a second programmable logic module FPGA #n via an inter-FPGA bus.

Optionally, a method according to the invention can also be used for the division into a plurality of sub-models, such as a third sub-model implemented on the second programmable logic module FPGA #n. In addition to processors and programmable logic modules, further components of a heterogeneous computing system can also be supported, such as GPUs or AI cores; in this case, the steps would be similar, although the individual blocks are merely allocated to the sub-models on the basis of a respective ruleset adapted to the different architectures.

Using an accordingly adapted ruleset, a method according to the invention can thus be expanded to the boundary between any domains such as:
programmable logic module—programmable logic module,
programmable logic module—graphics card or GPU,
processor and processor/microcontroller,
processor and graphics card or GPU,
first graphics card and second graphics card,
or even more than two domains per model.

Figure 3:
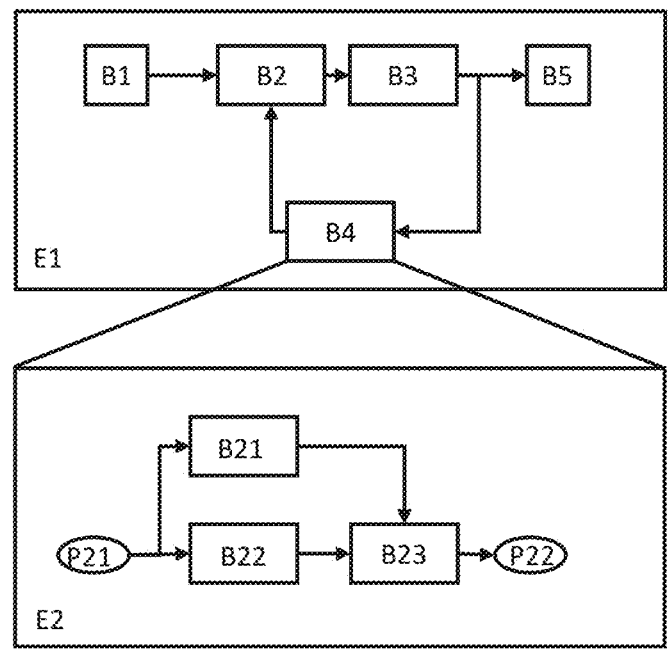
FIG. 3 shows a hierarchical simulation model.

FIG. 3 schematically shows a hierarchical simulation model. A plurality of blocks B1, B2, B3, B4, and B5, which implement the functionality of the model and are connected by signals, are arranged in a first hierarchical level E1. Block B4 is a sub-system of which the functionality is implemented by subordinate blocks in a second hierarchical level. The second hierarchical level E2 comprises an input port P21, blocks B21, B22, B23, and an output port P22.

Figure 4:
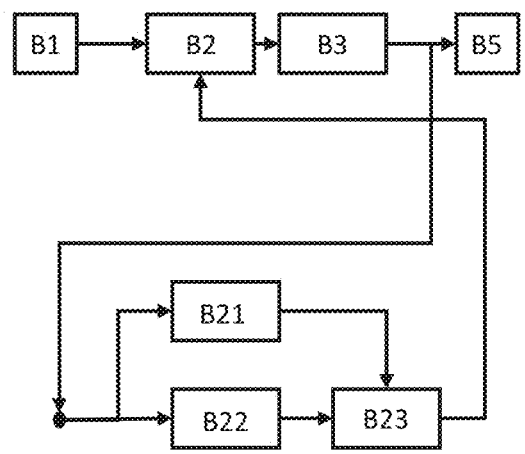
FIG. 4 shows a simulation model merged onto one level.

FIG. 4 shows the simulation model after the blocks have been merged in a common hierarchical level. The blocks B1, B2, B3 and B5 are still present. Sub-system B4 has been replaced with the subordinate blocks B21, B22 and B23. The input port P21 and output port P22, which were used for intra-model communication and not connected to a hardware resource, have been removed and replaced with direct signal links to the blocks B2 and B3.

Figure 5:
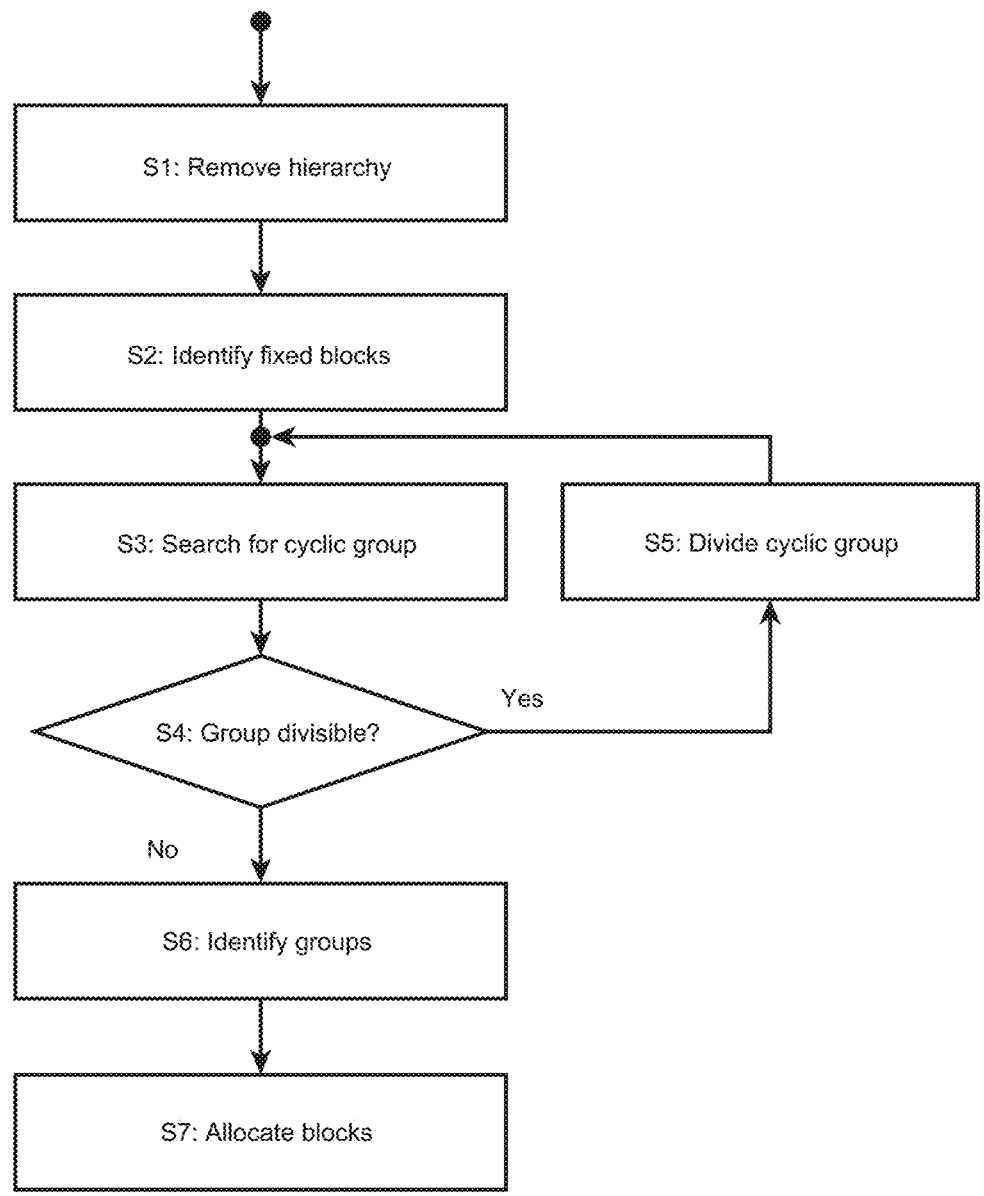
FIG. 5 is a schematic flowchart of a method according to the invention.

FIG. 5 shows a schematic flow chart of a method according to a preferred embodiment of the invention.

The starting point of a method according to the invention is expediently a complete model having sampling times, i.e., a complete model in which each block is allocated a sampling time either explicitly or implicitly (e.g., by way of default settings or inheritance). In particular, a sampling time should be understood as the time after which the block is executed again or after which the block inputs its input signals again and/or a new output value of the block is available. In addition, it is expediently assumed that blocks are atomic and that the resulting partitioning thus cannot run through blocks but only ever between the blocks. The method preferably proceeds in the following steps:

In step S1 (Remove hierarchy), the blocks of a hierarchical model are merged onto a common hierarchical level, as shown in FIGS. 3 and 4. Analyzing a hierarchically structured Simulink model having data buses would be complex and time-consuming, which is why structuring elements such as subsystems and buses are expediently removed or replaced with individual signals in the preparatory step. This allows for a high-performance, graph-based analysis in which all the in/out ports of a node and the origin thereof are directly known and are connected to the origin and destination thereof by an edge. This step is optional and can be carried out according to methods that are known per se. For example, the development environment Vivado from Xilinx provides a method of this kind for network list optimization under "flatten_hierarchy."

In step S2 (Identify fixed blocks), at least one first block is identified as belonging to the first sub-model and at least one second block is identified as belonging to the second sub-model. Owing to constraints resulting from the architecture, some blocks necessarily have to be implemented on the FPGA and some necessarily have to be implemented on the processor. The allocation (processor or FPGA) of these blocks is thus already fixed from the outset, which is why said fixed points are identified in a first step. For example, blocks having low latency have to be implemented on the FPGA whereas blocks downstream of the, e.g., complex interactions with the operating system (e.g., network protocols) have to be executed on the processor. In addition, blocks whose sampling time is below a given threshold value are assigned to the FPGA. Special I/O blocks are generally unambiguously allocated to one domain.

Figure 6:
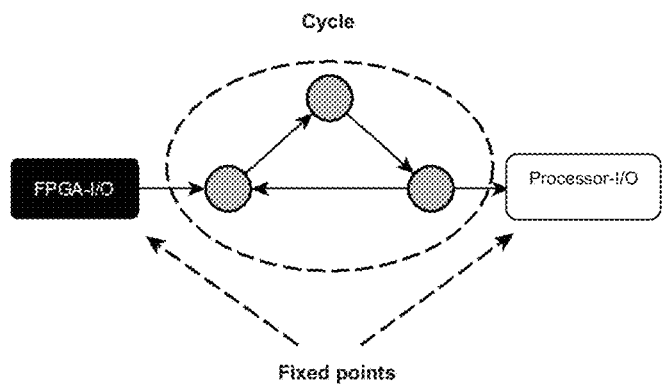
FIG. 6 is a schematic illustration of a model having two fixed points and an atomic cyclic group.

In step S3 (Search for cyclic group), a search is carried out for groups of blocks whose output values are cyclically dependent on one another. If the model comprises cyclic groups or cycles of this kind, these cycles are allocated in one of two classes. Cycles of this kind in which all the nodes have the same sample time are deemed to be atomic and are not partitioned any further. In other words, they are implemented in their entirety on the FPGA or in their entirety on the processor and can only be moved as a whole over an HW/SW boundary. In the process, I/O blocks are expediently not considered to be part of a cycle. FIG. 6 is a schematic illustration of a model having two fixed points and an atomic cyclic group in which all the blocks have the same sampling time.

Figure 7:
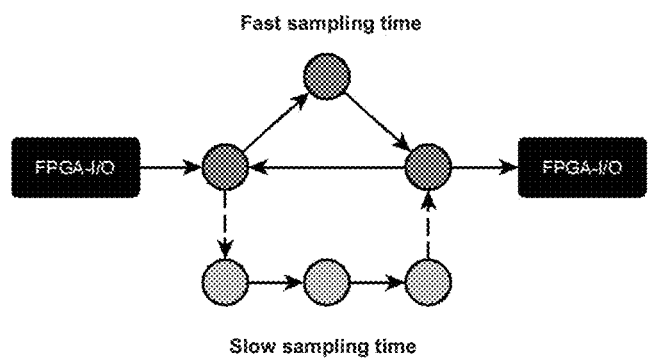
FIG. 7 is a schematic illustration of a subdivisible cyclic group comprising an atomic cyclic group having a fast sampling rate and a non-cyclic group having a slow sampling rate.

In step S4 (Group divisible?), a check is carried out as to whether the cyclic group can be subdivided any further. If the nodes of the cycle have different sampling times, they are not deemed to be atomic and can be subdivided further. This takes place in step S5 (Divide cyclic group). The subdivision is carried out at the transitions between portions having different sampling times. This results in new non-cyclic and cyclic sub-areas, which are then further treated recursively in accordance with the present method. In the present case, this recursion is indicated by a re-execution of step S3. FIG. 7 is a schematic illustration of a subdivisible cyclic group that has one part having a fast sampling time or high sampling rate and one part having a slow sampling time or low sampling rate and which can thus be divided into two parts: an atomic cyclic group and a non-cyclic group.

In step S6 (Identify groups), non-cyclic groups of blocks are identified. In this step, all the non-cyclic (feed-forward) portions of the model are identified. These are found upstream (fan-in) or downstream (fan-out) of the fixed points and the cycles. In these model portions, the possible partition boundaries are located between the FPGA and the processor; that is to say, among the blocks of a non-cyclic group the boundary between the first and second sub-models can be freely selected.

In step S7 (Allocate blocks), the individual blocks in non-cyclic groups and all the blocks of a cyclic group are allocated to either the first sub-model or the second sub-model, respectively. Once the fixed points, cycles, and non-cyclic dependencies have been identified, the complete model can be divided up in accordance with a predetermined ruleset.

The rules for deciding where a given model part is to be implemented can be set in consideration of the performance of the entire model, available resources, communications costs, and sampling times. The basic parameters can be selected on the basis of a user input, although a specification on the basis of heuristics or a measurement of expedient parameters through a design space exploration can also be provided.

Figure 8:
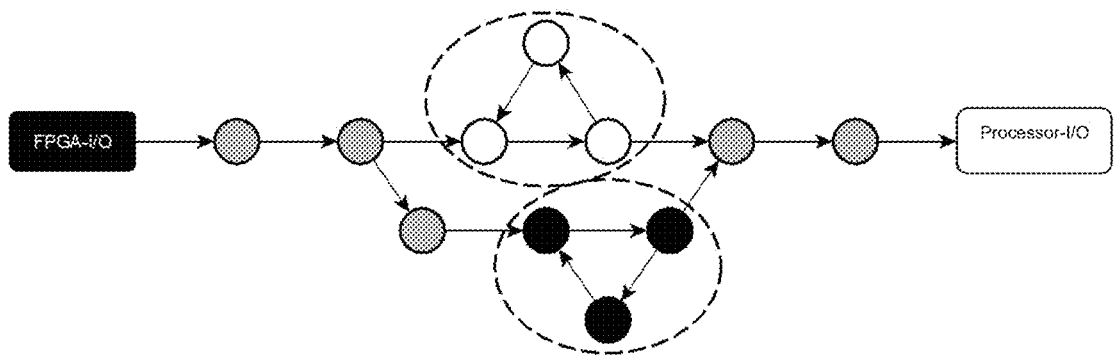
FIG. 8 is a schematic illustration of a model having a plurality of cyclic and non-cyclic groups.

Expediently, for each atomic cycle it is first decided where said cycle is to be implemented. FIG. 8 is a schematic illustration of the allocation of the cyclic groups of an example simulation model to either the first sub-model or the second sub-model; the upper cyclic group (solid-white circles) is allocated to the first sub-model and executed on the processor, and the lower cyclic group (solid-black circles) is allocated to the second sub-model and executed on the FPGA.

Figure 9:
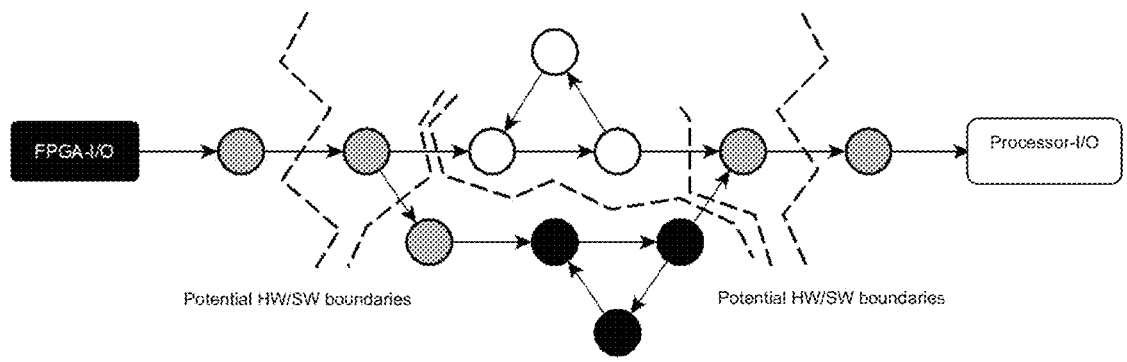
FIG. 9 is a schematic illustration for fine-tuning or setting the boundary within the non-cyclic model portions, a plurality of possible boundaries being indicated by way of example.

Once the cycles have been allocated, the hardware-software boundary between the blocks in non-cyclic groups is preferably fine-tuned, this boundary now being able to be shifted toward the FPGA or processor within the non-cyclic portions. To allocate the blocks in non-cyclic groups, the same criteria can be applied as for allocating the cycles. The essential difference is that here the boundary can be shifted block by block, corresponding to a finer granularity. Optionally, cycles of a relatively slow domain can also be shifted to faster ones (e.g., processor to FPGA) if their allocation was determined solely by the sampling time. FIG. 9 is a schematic illustration for fine-tuning or setting the boundary within the non-cyclic model portions, five possible boundaries being shown by way of example.

A method according to the invention can be used to partition a complete, not-yet-subdivided model into processor and FPGA portions, or to repeat an existing subdivision of a complete model that has already been subdivided into processor and FPGA portions. In this case, the following steps are preferably executed:
1. Partitioning
2. Automatic proposal of boundaries between the processor and FPGA
3. Interactive shifting of the boundary Preferably, a method according to the invention is used together with a transformation tool such as the HDL Coder from MathWorks or the Xilinx System Generator. Model blocks or entire subsystems can then be used in a simple manner in both the processor model and the FPGA model by using said tools to generate, for each block, source code for a processor or HDL code for an FPGA.

Automatically proposing boundaries between the processor and FPGA is advantageous for partitioning a complete model that does not yet have a fixed block allocation and consists solely of the processor or FPGA portions, or for re-partitioning a complete model that already has set partitions for the processor and FPGA. By ignoring any block association with a domain, both cases can be treated equally.

The model portions are classified into the domains in accordance with a preferred embodiment of the invention on the basis of the following two rules:

Rule 1: Model portions that need not run on the FPGA are swapped out to the processor. In doing so, Rule 2 should be borne in mind.

Rule 2: Since the transfer of data often cancels out the time gain when calculations are swapped out to a computing device that is potentially faster, the transfer of data should be minimized. Therefore, the minimum possible cut in terms of data capacity in view of Rule 1 is drawn as the boundary in the model graph. This minimizes the duration of the data transfer.

Additionally or alternatively, criteria such as a task turn-around time of a processor model, a maximum number of available logic resources such as FlipFlops, LUTs, DSPs, RAM, AI cores of an FPGA model, or a predetermined clock of the programmable logic module can be considered. These values can be ascertained on the basis of a synthesis of the complete model, even if the model as a whole would be much too large for the FPGA. In this synthesis, a "virtual" network list is expediently generated, from which the resources of the individual model blocks/subsystems and the approximately achievable clock is ascertained and is used as a basis for setting the model boundaries. The subsequent steps of placement and routing to a concrete FPGA, as carried out in a regular build for a programmable logic module, are preferably omitted.

Once a model has been automatically subdivided, the boundary between the processor and FPGA can preferably be interactively shifted.

Starting from a model subdivided into partitions for the FPGA and partitions for the processor, the different partitions are preferably graphically shown in the model in highlighted form or in a graphical user interface. In addition, all currently existing or proposed model boundaries are preferably shown in the model. Alternatively or additionally, these partitions and the boundaries can also be displayed in a graph of the model that has been generated on the basis of a method according to the invention. The currently drawn boundary can also run within a partition instead of between two partition boundaries, as will be discussed below. In this case, it is important than an FPGA model generally is not represented by a single contiguous graph, but rather by a plurality of island graphs. This is because a plurality of autonomous functionalities are often implemented in one FPGA and these do not communicate with one another but rather either provide a fixed functionality that is connected merely via I/O pins or each only communicate with one processor portion. Generally, therefore, there is not only one boundary between the processor and FPGA, but rather one for each island graph, i.e., for functionalities that are completely independent of one another.

Users are then preferably given the option, after clicking on a boundary in the model or in the graph of the model, to interactively shift this special boundary more toward the processor or the FPGA, e.g., by shifting it using a slider or directly shifting it in the model or the graph of the model. In addition, the granularity of the model depiction can be reduced by parts that can only be shifted as a whole (such as atomic cyclic groups) being combined to form individual subsystems/node points.

In doing so, one or more of the following details are preferably interactively shown in updated form:

Interface width between the processor and the FPGA in bits and communication duration for transmitting these bits at a predetermined maximum data rate (e.g., 2.5 Gbit/s). Users can thus recognize the value by which their minimum achievable task period will change as a result of the communication. In one embodiment, the changes to the corresponding values in relation to the existing/proposed boundaries can also be displayed.

Required logic resources in the FPGA. These resources of the individual model blocks/subsystems and the approximately achievable clock can be ascertained on the basis of a synthesis of the complete model, said synthesis preferably being aborted once a non-implemented network list is created. As a result, it can be ascertained in advance whether an accordingly partitioned model can be executed on the real-time computer system.

In the following, the importance of the partitions for shifting the boundaries will be discussed. The partition view having the incorporated boundaries gives the user a lot of information at a glance, meaning that it is immediately visible whether a boundary is already on a partition boundary or within a partition. If the boundary is located within a partition that is suitable for the processor or the FPGA, it can be easily shifted toward the processor or the FPGA in a direction of the two partition boundaries, as a result of which the interface widths of the data communication may be altered.

Figure 10A:
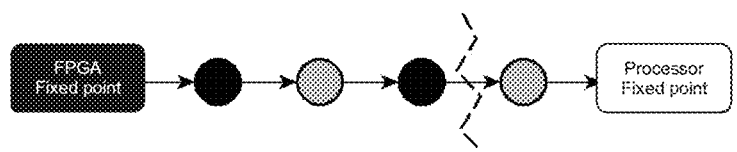
FIG. 10a is a schematic illustration of a simple model having one boundary.

FIG. 10a is a schematic illustration of a simple model having one boundary. On the left there is block that is permanently to be executed on the FPGA (FPGA fixed point), and on the right there is a block that is permanently to be executed on the processor (processor fixed point). In between there are a plurality of blocks, each connected by a signal line. In this case, blocks that are to be executed on the FPGA are shown in black, blocks that are to be executed on the processor are shown in white, and blocks that are to be arranged flexibly are shown in gray. In the partitioning shown, the user can enlarge their FPGA portion (the second sub-model) by shifting the boundary to the right. This leads to a pure FPGA model apart from the processor fixed point shown.

Figure 10B:
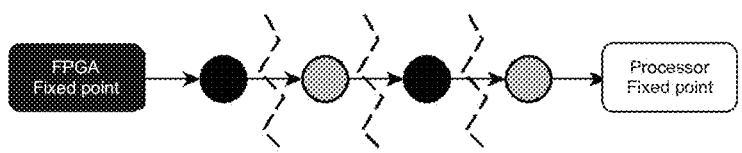
FIG. 10b is a schematic illustration of the simple model in which further boundaries have been inserted in the signal path by shifting the boundary.

Starting from the boundary shown in FIG. 10a, the user can alternatively enlarge the processor portion of the model and possibly even shift the boundary over a plurality of partitions. In the case of a boundary shifted to the left in this manner, a block to be executed on the FPGA would initially be located behind the boundary to the processor model (the right-hand black circle). If the user leaves both the block to be executed on the FPGA and the boundary unchanged, then in a preferred embodiment of the invention further boundaries are automatically inserted on the signal path. FIG. 10b is a schematic illustration of the simple model in which further boundaries have been inserted in the signal path in an automated manner. These boundaries require communication between the processor and the FPGA and thus increase the communication work, in which case the communication may have a blocking effect. In this context, blocking communication should be understood in particular to mean that a further calculation cannot take place until the data transmission between the processor and the FPGA has been completed.

Figure 10C:
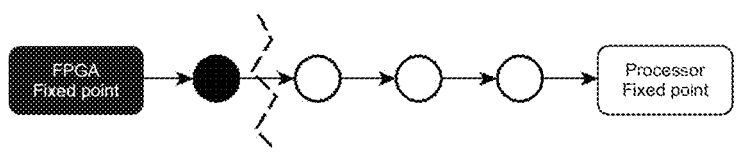
FIG. 10c is a schematic illustration of the simple model in which the shifted boundary has been retained but the number of further boundaries has been reduced.

If the user adapts their modeling in the FPGA partition or the corresponding block allocated to the FPGA (right-hand black circle) and allows this block to be allocated to the processor partition, the communication work is thus reduced. FIG. 10c is a schematic illustration of the simple model in which the shifted boundary has been retained but the number of further boundaries has been reduced as a result of a different adjustment of the middle block. Graphically illustrating the division of the model in a partition view makes it easier for the user to recognize that a different modeling leads to a lower number of boundaries or transitions between the processor and the FPGA. Due to the lower amount of communication work, the different modeling can result in quicker execution of the complete model.

Alternative embodiments of the invention also make it possible to set a larger number of boundaries, in particular two each, between the processor portion and the FPGA portion. By defining appropriate rules, additional portions can be defined at the boundary between the FPGA and the processor and the execution thereof can be set flexibly. If, for example, not just one separating line but two are defined in the complete model or in the model graph of the complete model for each input and output boundary between the model portions, the result is one zone between each model portion. The blocks in zones therebetween can then be executed on the processor, for example, while the rest of the model is implemented on the FPGA.

The invention thus makes it possible to break down models automatically or in a computer-assisted manner for execution on heterogeneous simulators, and this can significantly reduce the time required for designing a simulation.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for dividing a graphical simulation model up into a first sub-model and a second sub-model, wherein functionality of the graphical simulation model is modeled in the form of blocks that are connected by signals at least in part, wherein the blocks are periodically executed and each block of the simulation model is allocated a sampling time, wherein the first sub-model is to be executed on a processor and the second sub-model is to be executed on a programmable logic module, the method comprising the successive steps of:
   a. identifying at least one first block as belonging to the first sub-model and identifying at least one second block as belonging to the second sub-model based on the sampling time and/or a resource allocation;
   b. searching for cyclic groups of blocks, wherein a cyclic group whose blocks all have the same sampling time is deemed to be atomic;
   c. identifying non-cyclic groups of blocks;
   d. allocating individual blocks from the cyclic groups of blocks and the non-cyclic group of blocks to either the first sub-model or the second sub-model, wherein all blocks of an atomic cyclic group are allocated to the same sub-model;
   e. generating program code for the processor from the first sub-model; and
   f. generating a configuration bitstream for the programmable logic module from the second sub-model.

2. The method according to claim 1, wherein the simulation model comprises at least one block in a first hierarchical level and at least one block in a second hierarchical level, and wherein the blocks of the simulation model are merged in a common hierarchical level.

3. The method according to claim 2, wherein the simulation model includes input ports, output ports, and/or buses, and wherein merging the blocks of the simulation model in a common hierarchical level comprises removing at least some of the input ports, output ports, and/or buses and inserting corresponding signals.

4. The method according to claim 1, wherein a block is identified as belonging to the second sub-model based on one or more of the following conditions being met:
   I. the block is allocated a sampling time that is below a predetermined sampling threshold;
   II. the block is allocated a latency that is below a predetermined latency threshold; or
   III. the block is allocated a resource of the programmable logic module.

5. The method according to claim 1, wherein a block is identified as belonging to the first sub-model based on one or more of the following conditions being met:
   I. the block describes a function call of an operating system and/or an access to a network interface; or
   II. the block is allocated a resource of the processor.

6. The method according to claim 1, wherein the step of searching for cyclic groups comprises a recursive subdivision, and a check being carried out for a discovered cyclic group as to whether the blocks all have the same sampling time; and
   wherein in case that the blocks all have the same sampling time, the cyclic group is deemed to be atomic and is retained, and wherein in case that the blocks do not all have the same sampling time, the cyclic group is subdivided, among blocks having different sampling times, into new cyclic or non-cyclic sub-groups until there are no more subdivisible cyclic groups.

7. The method according to claim 1, wherein the step of allocating the individual blocks from the groups to either the first sub-model or the second sub-model is carried out based on a predetermined rule.

8. The method according to claim 7, wherein, according to the predetermined rule, all the blocks that need not be executed on the programmable logic module are allocated to the first sub-model.

9. The method according to claim 8, wherein a block has to be executed on the programmable logic module based on the block being connected, by way of a signal, to a block that has been identified as belonging to the second sub-model, wherein the signal has a higher bit width than a width threshold and/or a higher change frequency than a change threshold and/or a shorter latency than a signal latency threshold.

10. The method according to claim 1, wherein after the step of allocating the individual blocks to either the first sub-model or the second sub-model, a graphical depiction of the divided model is displayed via a user interface, and wherein changes to the division are received via the user interface.

11. The method according to claim 10, wherein based on a lack of a resource allocation, blocks that can be allocated to both the first sub-model and the second sub-model are identified, wherein these blocks are shown in highlighted form on the user interface, and wherein these blocks are allocated based on a user input.

12. The method according to claim 1, wherein after the step of allocating the individual blocks to either the first sub-model or the second sub-model, an additional step of inserting communications blocks is carried out, wherein a check is carried out for two blocks connected by a signal as to whether these two blocks are allocated to different sub-models, and wherein a pair of communications blocks is inserted based on the two blocks being allocated to different sub-models, wherein the pair of communications blocks implement a data exchange between the processor and the programmable logic module.

13. The method according to claim 1, further comprising:
g. transmitting the program code and the configuration bitstream to a real-time computer system comprising the processor and the programmable logic module; and
h. performing a simulation with the processor executing the program code and the functionality of the programmable logic module being determined by the configuration bitstream.

14. A computer system, comprising:
an operator computer, which has a user interface; and
a real-time computer having a processor, a programmable logic module, and I/O circuits; and
a non-volatile memory having instructions stored thereon for carrying out a method for dividing a graphical simulation model up into a first sub-model and a second sub-model, wherein functionality of the graphical simulation model is modeled in the form of blocks that are connected by signals at least in part, wherein the blocks are periodically executed and each block of the simulation model is allocated a sampling time, wherein the first sub-model is to be executed on the processor and the second sub-model is to be executed on the programmable logic module, the method comprising the successive steps of:
a. identifying at least one first block as belonging to the first sub-model and identifying at least one second block as belonging to the second sub-model based on the sampling time and/or a resource allocation;
b. searching for cyclic groups of blocks, wherein a cyclic group whose blocks all have the same sampling time is deemed to be atomic;
c. identifying non-cyclic groups of blocks;
d. allocating individual blocks from the cyclic groups of blocks and the non-cyclic group of blocks to either the first sub-model or the second sub-model, wherein all blocks of an atomic cyclic group are allocated to the same sub-model;
e. generating program code for the processor from the first sub-model; and
f. generating a configuration bitstream for the programmable logic module from the second sub-model.

15. A non-transitory computer-readable storage medium having processor-executable instructions stored thereon for dividing a graphical simulation model up into a first sub-model and a second sub-model, wherein functionality of the graphical simulation model is modeled in the form of blocks that are connected by signals at least in part, wherein the blocks are periodically executed and each block of the simulation model is allocated a sampling time, wherein the first sub-model is to be executed on a processor and the second sub-model is to be executed on a programmable logic module, wherein the processor-executable instructions, when executed, facilitate performance of the successive steps of:
a. identifying at least one first block as belonging to the first sub-model and identifying at least one second block as belonging to the second sub-model based on the sampling time and/or a resource allocation;
b. searching for cyclic groups of blocks, wherein a cyclic group whose blocks all have the same sampling time is deemed to be atomic;
c. identifying non-cyclic groups of blocks;
d. allocating individual blocks from the cyclic groups of blocks and the non-cyclic group of blocks to either the first sub-model or the second sub-model, wherein all blocks of an atomic cyclic group are allocated to the same sub-model;
e. generating program code for the processor from the first sub-model; and
f. generating a configuration bitstream for the programmable logic module from the second sub-model.

* * * * *